United States Patent [19]

Hong et al.

[11] Patent Number: 5,138,624
[45] Date of Patent: Aug. 11, 1992

[54] MULTIWAVELENGTH LED AND LASER DIODE OPTICAL SOURCE

[75] Inventors: Chi-Shain Hong; Luis Figueroa, both of Bellevue; Veeravana S. Sundaram, Issaquah, all of Wash.

[73] Assignee: The Boeing Company, Seattle, Wash.

[21] Appl. No.: 752,163

[22] Filed: Aug. 22, 1991

Related U.S. Application Data

[63] Continuation of Ser. No. 437,645, Nov. 16, 1989, abandoned.

[51] Int. Cl.$^5$ ............................................. H01S 3/19
[52] U.S. Cl. ................................. 372/45; 372/23; 372/46; 372/47; 372/50; 372/97; 357/16; 357/17
[58] Field of Search ............... 372/44, 45, 46, 47, 372/50, 23, 68, 97, 11, 98; 357/16, 17

[56] References Cited

U.S. PATENT DOCUMENTS

| 3,676,795 | 7/1972 | Pratt, Jr. | 372/28 |
|---|---|---|---|
| 4,277,759 | 7/1981 | Tanaka et al. | 372/47 |
| 4,318,059 | 3/1982 | Lang et al. | 372/47 |
| 4,503,540 | 3/1985 | Nakashima et al. | 372/47 |
| 4,630,083 | 12/1986 | Yamakoshi | 357/17 |
| 4,637,122 | 1/1987 | Carney et al. | 29/569 L |
| 4,740,978 | 4/1988 | Göbel et al. | 372/50 |
| 4,747,110 | 5/1988 | Takahashi et al. | 372/50 |
| 4,802,182 | 1/1989 | Thornton et al. | 372/50 |
| 4,811,353 | 3/1989 | Noda et al. | 372/45 |
| 4,817,103 | 3/1989 | Holoryak, Jr. et al. | 372/45 |
| 4,817,110 | 3/1989 | Tokuda et al. | 372/45 |
| 4,831,630 | 5/1989 | Scifres et al. | 372/50 |
| 4,843,611 | 6/1989 | Kwong et al. | 372/46 |
| 4,860,069 | 8/1989 | Yamazaki | 357/17 |
| 4,872,180 | 10/1989 | Rideout et al. | 372/99 |
| 4,888,782 | 12/1989 | Kakimoto | 372/46 |
| 4,901,330 | 2/1990 | Wolfram et al. | 372/75 |
| 4,937,638 | 6/1990 | Batlin et al. | 357/17 |
| 4,982,408 | 1/1991 | Shimizu | 372/45 |

FOREIGN PATENT DOCUMENTS

60-236276 11/1985 Japan ..................... 372/23

Primary Examiner—Georgia Y. Epps
Attorney, Agent, or Firm—Donald J. Lisa

[57] ABSTRACT

The invention relates to the design of multiwavelength LED devices having multiple-lobe optical spectrums and laser diode devices with multiple designated wavelengths wherein the devices are formed by stacking various active layers of selected semiconductor materials whereby each layer is assigned to be active at a different wavelength. The independent layers are active at different wavelengths based on both their material composition and Quantum Well geometry. Independent control of current to each layer is allowed which in effect controls the spectral intensity distribution and the spectral widths. The step of allowing independent control of the current is achieved by considering the probabilities of carrier capturing, recombining carriers at various active layers and minimizing the current through all the barriers and cladding layers and optimizing the current through each active layer by controlling the individual thicknesses. For the LED device, the window and absorption sections within a Transverse Junction Geometry scheme exist to aid in control of the current within the device. For both the LED and laser devices, the active layer region can be varied in thickness in order to tailor the optical intensity of the devices.

7 Claims, 2 Drawing Sheets

MULTIWAVELENGTH LED AND LASER DIODE OPTICAL SOURCE

This is a continuation of copending application(s) Ser. No. 07/437,645 filed on Nov. 16, 1989 abandoned.

BACKGROUND OF THE INVENTION

The present invention relates in general to the design of light emitting diodes (LEDs) and laser diode structures and in particular, to an LED with a multiple lobe optical spectrum and a laser diode having multiple designated wavelengths.

Multiwavelength LEDs and laser diodes are key components for applications in multiplexed fiber optic data links and sensor networks. One example of this application is the standard fiber-optic interface system in future generation aircraft. The use of wavelength division multiplexing (WDM) techniques in the system is primarily due to a large number (e.g. 40–50) of sensors and data channels to be processed. The resolution of typical WDM elements is limited to 5–10 nm at the center wavelength of 800 nm. Therefore, optical sources with a spectral width of 200–500 nm and good coupling efficiency to the optical fiber are required. These dictate the need for specific edge-emitting LED designs for the unconventional spectral output.

Prior art LED and laser structures consist of an active layer sandwiched by a pair of larger bandgap cladding (or confinement) layers. The active layer can be a single layer on the order of 1000 Angstroms (1 Angstrom $= 10^{-8}$ cm) or a series of alternate thin layers (namely, Quantum Well and Barrier, respectively) on the order of 10s and 100s of Angstroms. The emission wavelength for the single layer case is determined by the bandgap energy of the semiconductor.

For the Quantum Well case, the emission wavelength is governed by the transition between the quantized energy levels in both the by the transition between the quantized energy levels in both the conduction and valence bands, which are a function of the Quantum Well thickness as shown in FIG. 1. The wavelengths of Quantum Well lasers and LEDs that can be achieved are shorter than in conventional devices. In addition, by virtue of the quatum size effect, the structures also show a lower "transparency" carrier (current) density, lower optical loss, and higher Quantum efficiency.

In U.S. Pat. No. 3,676,795, entitled "Multiple frequency Laser Apparatus", the inventor discloses an apparatus and method of obtaining multifrequency laser action out of a semi-conductor. This prior art invention, however, requires externally applied stress such as shear or uniaxial stress at variable degrees which is a relatively inefficient technique of achieving multiple wavelengths.

In U.S. Pat. No. 4,637,122, entitled, "Integrated Quantum Well Lasers having Uniform Thickness Lasing Regions for Wavelength Multiplexing", Carney et al. disclose an integrated quantum well laser structure which provides a plurality of light beams each having a different wavelength for use in wavelength division multiplexing. Unfortunately, the range of wavelengths emitted by the laser is limited to the cavity loss in the Quantum Well.

In U.S. Pat. No. 4,747,110, "Semiconductor Laser Device capable of emitting laser beams of different Wavelengths", Takahashi et al. disclose a semiconductor laser device in which the wavelength range is limited to the variation of the Quantum Well thickness. The wavelength variation, in effect, is limited to the rate of growth on crystallographic orientation.

Most conventional LEDs and lasers are designed for a narrow spectral width. Prior art devices teach that the conventional way of achieving multiwavelength LED or laser diode structure comprises an array of conventional LEDs or lasers with various wavelengths which requires large number of fibers and connectors. This results in inefficient or low optical power and reliability for the systems. A new design is therefore needed to increase the efficiency and reliability of multiwavelength LEDs/lasers to be used in various applications such as in WDM techniques.

SUMMARY OF THE INVENTION

It is therefore an object of the present invention to provide a new and improved method and apparatus of generating multiwavelength emissions from LED or laser semiconductor optical sources.

It is further an object of the present invention to provide a new and improved design of an LED structure capable of emission with a multiple lobe optical spectrum and a laser diode structure capable of emission with multiple designated wavelengths.

It is still further an object of the present invention to provide a new and improved method and apparatus for generating multiwavelength emissions from LED or laser semiconductor optical sources which use materials selected on the wavelength coverage desired.

It is still further an object of the present invention to provide a new and improved method and apparatus for generating multiwavelength emissions from LED or lasers semiconductor optical sources which simplify multiplexed fiber-optic network designs using hybrid integration of discrete wavelength sources.

It is still further an object of the present invention to provide a new and improved method and apparatus of generating multiwavelength emissions from LED or laser semiconductor optical sources which simplify multiplexed fiber-optic network designs by using a smaller number of fibers and connections by eliminating the requirement of an array of conventional LED or lasers having various wavelengths used.

It is still further an object of the present invention to provide a new and improved method and apparatus for generating multiwavelength emissions from LED or laser semiconductor optical sources that have greater optical power and reliability for application systems.

It is still further an object of the present invention to provide a new and improved method and apparatus for generating multiwavelength emissions from LED or laser semiconductor optical sources in which the structure shows a lower "transparency" carrier (current) density, lower optical loss, and higher Quantum efficiency.

These and other objects and advantages of the present invention are achieved by stacking individual active layers upon one another in comprising the active layer region of the device. Each of these various active layers is separated by a thin barrier which defines an individual optical channel and minimizes the cross talk and absorption. Independent control of the current to each layer has been allowed in order to control the spectral intensity distribution and the spectral widths. To ensure even more efficient control, the currents through all the barriers and cladding layers have been minimized, and the currents through the active layers have been optimized. Also, the electrode utilized for the laser structure has been designed for this type of current control.

The objects and advantages described above will become apparent to those skilled in the art upon consideration of the accompanying specification and drawings.

BRIEF DESCRIPTION OF THE DRAWINGS

The above mentioned and other features and objects of the present invention and the manner of attaining them will become apparent and the invention itself will be best understood by reference to the following description of an embodiment of the invention taken in conjunction with the accompanying drawings wherein.

DESCRIPTION OF THE PREFERRED EMBODIMENT

Figure 1:
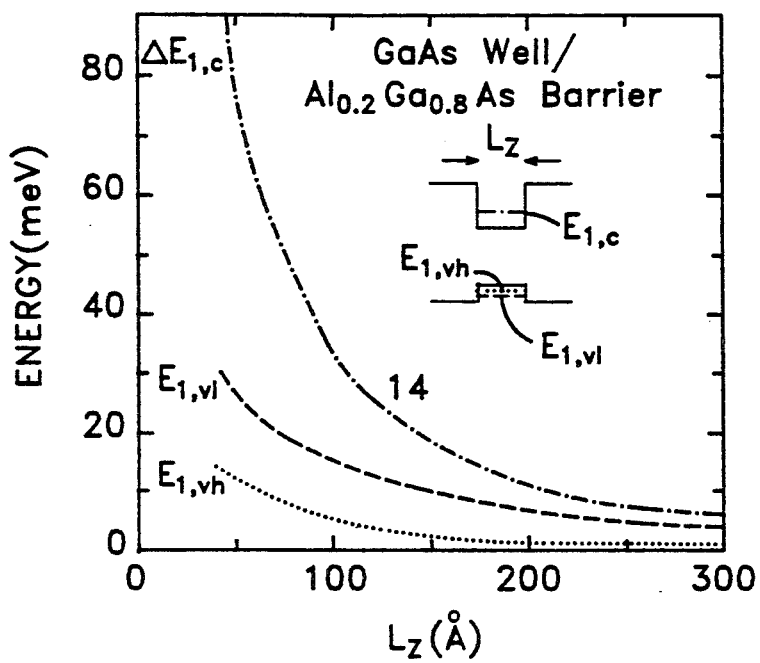
FIG. 1 is a graphical illustration which represents the relationship of the quantized energy level for electrons and holes as a function of well size.

Referring specifically to FIG. 1, curve 10 shows a plot of the light hole energy as a function of well size. Curve 12 shows a plot of the heavy hole energy level as a function of well size. Curve 14 of FIG. 1 shows a plot of the electron energy as a function of well size. It is a plot of the quantized energy levels in both the conduction and valence bands, which are a function of the Quantum Well thickness. The relationship in FIG. 1 is important because the emission wavelength in a Quantum Well case is governed by the transition between the quantized energy levels in the conduction band and the quantized energy levels in the valence band. These bands which determine electron and hole energy level are a function of Well thickness. The advantage of using Quantum Well in lasers and LEDs is the capability of achieving shorter wavelengths. The Quantum Well concept and theory is incorporated into each active layer of the present invention in order to generate a broad range of wavelength emissions. Other advantages to using Quantum Well are that the structures affected by the quantum well size show lower "transparency" carrier (current) density, lower optical loss, and higher quantum efficiency.

In the preceding description in conjunction with the figures, GaAlAs is exemplary. It should be noted by those skilled in the art that other materials can be utilized, and this application is therefore not limited to GaAlAs.

Figure 2:
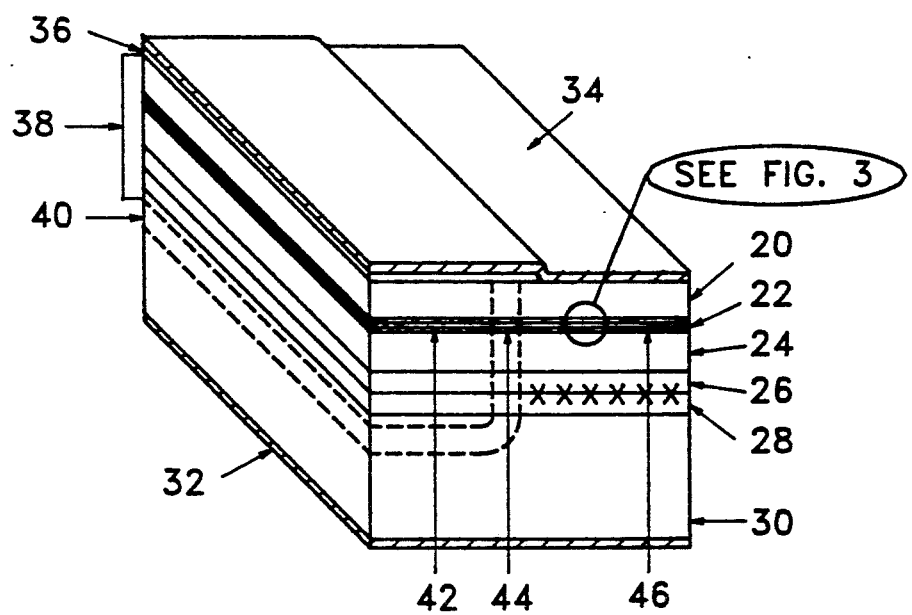
FIG. 2 is a cross sectional diagram of a multiwavelength laser which illustrates the stacking of various layers in accordance with the present invention.

Referring specifically to FIG. 2, region 30 is a p-doped substrate. A region 28, which is similar in composition to region 30 except it is n-doped, is grown on top of region 28. In the GaAlAs example, region 30 would be a p-GaAs substrate, and region 28 would be a n-GaAs layer.

On top of region 28 a p-doped region 26 is formed. On top of region 26 a n-doped region 24 is grown. Region 24 and region 26 are composed of the same elements. Regions 24 and 26 are cladding (or confinement) layers. In the GaAlAs example, region 26 would be a p-doped $Ga_{1-x}Al_xAs$ layer, and region 24 would be a n-doped GaAlAs layer. X is the mole fraction of Al.

On top of region 24, a region 22 is grown. Region 22 is the active layer region, and it represents one of the novel components of the present invention.

Figure 3:
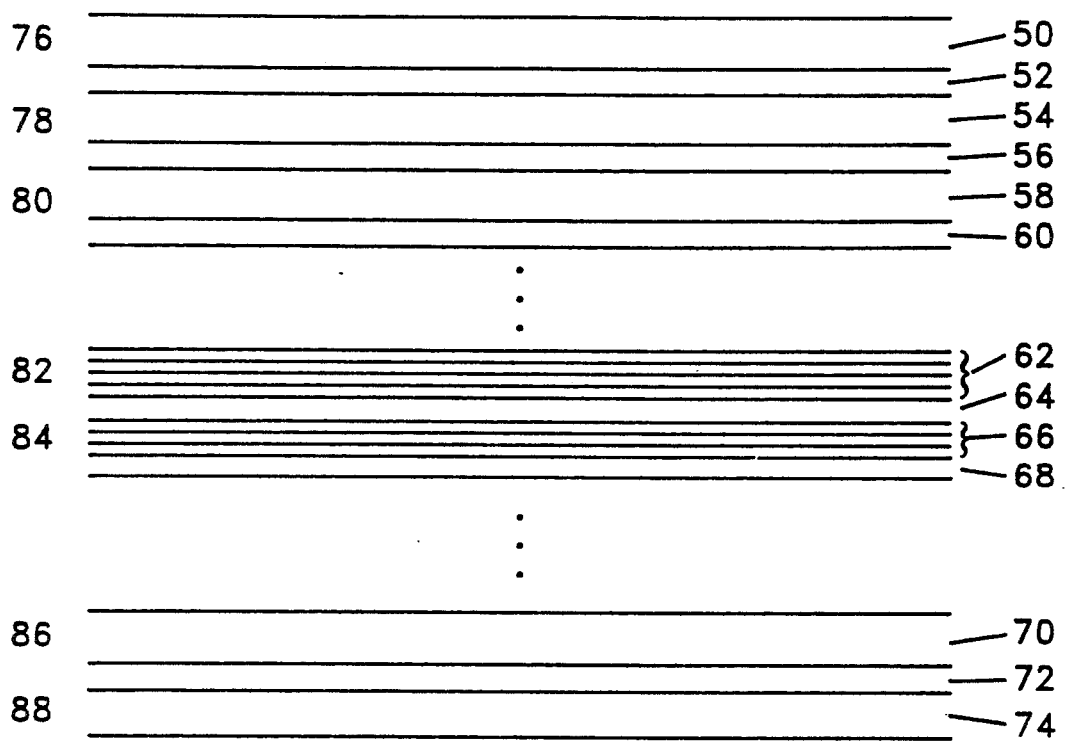
FIG. 3 is an exploded cross sectional diagram of the active region in FIG. 2 showing the various active region layers each corresponding to a wavelength in accordance with the present invention.

Referring specifically to FIG. 3, the active layer region 22 of FIG. 2 is shown in greater detail. The entire active layer is comprised of stacking various individual active layers. In FIG. 3 this comprises stacking regions 50, 54, 58, 62, 66, 70, and 74 on top of one another. Each of these stacked regions, however, are separated by a thin barrier. In FIG. 3, these thin barriers are regions 52, 56, 60, 64, 68, 72. Each active layer, therefore corresponds to a certain wavelength emission. In the GaAlAs example, different Al compositions and different well sizes can be combined in order to obtain desired wavelength coverage. The significance of barrier regions 52, 56, 60, 64, 68, 72 which are between the active layers is that they define individual optical channels and minimize the cross talk and absorption in practical applications.

Regions 50 through 74 of FIG. 3 can be grown by epitaxial techniques such as MOCVD and MBE and the number of active layers, i.e. regions 50, 54, 58, 62, 66, 70, 74 of FIG. 3, that can be stacked in the structure depends on the effectiveness of the heat dissipation of the device. It is extremely important that the device be bonded junction-side-down. This is one of the reasons for using a p-type conducting substrate rather than a semi-insulating substrate. The use of a p-substrate leads to lower series resistance which improves the thermal and optical power handling of the device. The design of this invention is anticipated to handle three to five active layers for a single device and still provide adequate heat sinking.

Referring back to FIG. 2, after region 22 has been created, region 20 which has the same composition of region 24, is grown on top of region 22. Region 20 is a n-doped region, and in the GaAlAs example it would be a n-doped GaAlAs layer. Also, in the GaAlAs example, a region 36 of $Si_3N_4$ is grown on top of a strip (e.g. half of the device) of region 20. Finally, a metal region 34 exists at the very top of the structure, and a metal region 32 exists at the very bottom of the structure which function as conductors. Regions 20, 22, 24, 26, 28 and 30 of FIG. 2 can be readily grown by expitaxial techniques such as MOCVD and Molecular

Beam Epitaxy (MBE)

The design in FIG. 2 considers the probabilities of carrier capturing and recombination at various active layers when the p-n junction is biased i.e. the p-region being regions 42 and 44 of FIG. 2 and the n-region being region 46 of FIG. 2 as pointed out in the active region. If a conventional single p-n junction were used to handle these multiple active layers, this would likely result in a preferential carrier capturing in the low energy active layer at the expense of light from the higher energy ones. A better method of ensuring excitation of all the active layer is to use a transverse junction stripe (TJS) geometry, in making the p-n junctions as shown in FIG. 2 at regions 24, 26, and 28. Since region 36 of the $Si_3N_4$ is only on a portion of the device, the current will flow unimpeded on the half without $Si_3N_4$.

In the TJS design, the current flows parallel to the layers in region 22 of FIG. 2 under the bias. The amount of current flowing in each different layer obeys the following equation:

$$(kt/q)\ln(J_1/J_{01})+R_{s1}J_1 = (kt/q)\ln(J_2/J_{02})+R_{s2}J_2 = .$$

where $$J_1 = J_{oi}\exp(qV_i/kt) \text{ and } J_{oi}/J_{oj} = \exp((E_{gj}-E_{gi})/kt)$$

where:

i,j = 1,2, ..., the number of various layers involved,
k = Boltzman constant
t = temperature
q = unit electron charge
$V_i$ = junction voltage
$E_{gi}$ = Bandgap energy
$R_{si}$ = Series resistance
$J_i$ = Current density for $i^{th}$ layer.

Shunt currents through all the barriers, regions 52, 56, 60, 64, 68, 72 of FIG. 3, and cladding layers, will be minimized. Shunt currents through the active layers, regions 50, 54, 58, 62, 66, 70, 74, of FIG. 3 will be maximized. This will be accomplished by properly designing the layer thickness of regions 50, 54, 58, 62, 66, 70, 74 of FIG. 3.

The current density at each active layer, regions 50, 54, 58, 62, 66, 70, 74 of FIG. 3, will be designed and distributed such that it compensates for differences of internal quantum efficiency in emitting a flat spectral intensity over the wavelength range. The structure can also allow the output spectral envelope to be tailored to applications such as commercial CCD arrays which use Wavelength-Division-Multiplexing elements in interfacing read outs of various wavelengths.

FIG. 2 shows that this TJS geometry makes use of a $p^+$-p-n doping profile. The $p^+$-region is a Zn-diffused layer and is region 38 of FIG. 2. The p-region is also a Zn diffused region and is region 40 of FIG. 2. The n-region comprises the rest of the structure. The Zn diffusion is used to provide the device with an optical waveguide. This waveguide is used to confine the optical mode to the junction region. The doping profile has the advantage of optical confinement lateral to the junction direction. A further advantage when used in conjunction with the Quantum Well structures is that a single heterojunction can be created so that the device will be less temperature sensitive. Finally, region 34 of FIG. 2 comprises of the electrode metal contact extending through the whole cavity, which is the top portions of regions 36 and 20. This makes up the electrode design of the laser structure.

Figure 4:
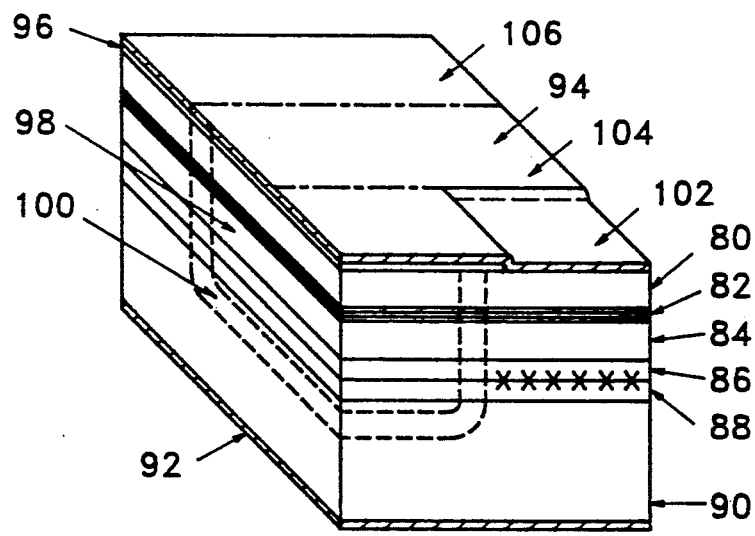
FIG. 4 is a cross sectional diagram of a LED structure in accordance with the present invention.

The multiwavelength LED structure illustrated in FIG. 4 is very similar to the multiwavelength laser structure of FIG. 2 except for a few minor differences. The structure of FIG. 4 is fabricated in the same manner as the laser structure illustrated in FIG. 2 and as described above.

However, the facet-mirror feedbacks, which exist in the laser structure of FIG. 2, cannot exist in a LED structure and need to be suppressed. In FIG. 4, this is accomplished by providing region 104 which is an absorption section consisting of an insulated, unpumped end-section or an anti-reflection coating on the facets. Region 104 (of FIG. 4) absorption section in conjunction with region 106 (of FIG. 4) window section are used to effectively reduce the facet reflectivity to a satisfactory level (e.g., $<1\times10^{-5}$). Regions 104 and 106 are simply comprised of the metal contact layer 94. $Si_3N_4$ exists under regions 104 and 106 to suppress the current in those regions. Therefore, current only flows within region 102 which is the pumped section, and the current flow is not continuous.

The absorption region 104 and window region 106 within the TJS structure are also novel parts of this invention. The Zn-diffused regions (e.g. regions 98 and 100) only exist under the absorption (region 104) and pumped (region 102) sections in FIG. 4. This is contrasted with FIG. 2 in which the diffused region extends all the way to the back of the device. The reason for having no diffusion and no current in the region 106 window section is to provide more spreading out of the emission wavelength. However, diffusion is still desired under the absorption section, since the spreading out of the emission wavelength is not desired in that region. Therefore, it is seen that suppression of the facet reflectivity is critical for achieving high linearity of light current characteristics for edge-emitting LEDs. Each active layer of the LED of FIG. 4 has different wavelength emissions that are simultaneously produced since an LED has no threshold current. This produces a continuous spectrum as a function of wavelength to tailor the device for use in a standard optic interface which allows the use of wavelength division multiplexing techniques.

Finally, another novel part of this invention relates to the thickness of the active layer region of the laser and LED device (e.g. region 22 of FIG. 3 and region 82 of FIG. 4). The thickness of the active layer region determines the optical intensity of the device. Therefore, if the active layer region is made thicker, the optical intensity of the device will be made higher.

What has been provided, therefore, is an improved design for providing multiwavelength LED devices having multiple-lobe optical spectrums and laser diode devices with multiple designated wavelengths. The devices are formed by stacking various active layers where each layer is assigned to emit a corresponding wavelength. The wavelength emitted depends on both the material composition and Quantum Well geometry. Independent control of the current to each layer allows control of the spectral intensity distribution and spectral widths. Bias of the entire active layer region is ensured by use of a TJS geometry. The current is even better controlled by minimizing the shunt currents through all the barriers and cladding layers and maximizing the current through the active layer.

While a specific embodiment of this invention has been shown and described, further modifications and improvements will occur to those skilled in the art. I desire it to be understood therefore, that this invention is not limited to particular form shown and I intend to cover all modifications which do not depart from the spirit and scope of the invention.

What is claimed is:

1. An optical light emitting diode (LED) source for generating multiwavelength emissions over a continuous band from a semiconductor device comprising:

a contact metal layer;
a semiconductor substrate layer disposed on said contact metal layer;
a first semiconductor layer disposed on said substrate;
a second semiconductor layer disposed on said first semiconductor layer;
a third semiconductor layer disposed on said second semiconductor layer;
a stack of distinct Quantum Well active layer regions of compositions that are active at different wavelengths, said layer regions being individually separated by thin barrier regions which confine injected carriers from the active layers, there being one barrier region on each side of each active layer region, said stack of active layer and barrier regions all having been grown on said third semiconductor layer;

a fourth semiconductor layer disposed on said active layer stack;

means for injecting carriers into said stack of layers to cause simultaneous radiation emission from end regions of said stack of active layers;

means for absorbing light emission to prevent lasing;

an insulative layer disposed on a portion of the fourth layer; and an electrode metal contact layer disposed on top of said fourth layer and said insulative layer.

2. A semiconductor light emitting diode source as set forth in claim 1 wherein wavelengths of optical emissions at which the active layer regions become active are superposition of emissions from all the active layers with varying Quantum Well thickness while material composition remains constant.

3. A semiconductor light emitting diode source as set forth in claim 1 wherein wavelengths of optical emissions at each active layer are varied by varying material composition.

4. A semiconductor light emitting diode source as set forth in claim 1 wherein wavelengths of optical emissions at each active layer are varied by varying both material composition and Quantum Well thickness.

5. A semiconductor light emitting diode source as set forth in claim 1 wherein the distinct active layer regions are separated by barrier layers that are disposed between adjacent ones of said distinct active layers to define individual optical channels for radiant energy emissions in an active layer sandwiched between two barrier layers.

6. An optical light emitting diode source for generating multiwavelength emission over a continuous band from a semiconductor device comprising:

a contact metal layer;

a semiconductor substrate disposed on said contact metal layer;

a first semiconductor layer disposed on said substrate;

a second semiconductor layer disposed on said first semiconductor layer;

a third semiconductor layer disposed on said second semiconductor layer;

a stack of alternating active and barrier layer regions, said active layer regions being made of compositions that are active to emit radiant energy at optical wavelengths that are sufficiently different from the different active layers to be useful in multiplexing based on variations in material composition and Quantum Well thickness, said active and barrier layer regions being grown on said third semiconductor layer;

a fourth semiconductor layer disposed on said active layer stack;

means for injecting carriers into said stack of layers to cause simultaneous radiation emissions from first end regions of said stack of active layers, said carrier injecting means extending through said stack of active layer and barrier regions so as to respectively contact second opposite end regions of said stack;

means for absorbing light emission;

means for providing a light transparent section to spread out light emission to further prevent lasing;

an insulative layer disposed on a portion of the fourth layer; and an electrode metal contact layer disposed on top of said fourth layer and said insulative layer.

7. In an optical light emitting diode source for generating broad band continuous emissions in the optical spectrum that are useful in wavelength division multiplexing applications comprising:

a first plurality of semiconductor layers forming heterojunction that are supported on a substrate;

a stack of distinct active layer regions of compositions that are active to emit radiant energy over a continuous spectrum, said layer regions being separated by thin barrier regions which serve to define an individual optical channel for each of said active layer regions, said active layer and barrier regions being grown on top of said first plurality of semiconductor layers;

a further semiconductor layer grown on an upper surface of said stack forming another heterojunction;

carrier injection means for injecting carriers into said stack of active layers to cause simultaneous optical edge emissions from end regions of said stack of active layers, said carrier injecting means extending through said stack; and means for creating an optical absorption region and a window region for spreading out of the light emission.

* * * * *